US009692207B2

(12) United States Patent
Fang et al.

(10) Patent No.: US 9,692,207 B2
(45) Date of Patent: Jun. 27, 2017

(54) TUNABLE LASER WITH INTEGRATED WAVELENGTH REFERENCE

(75) Inventors: Alexander W. Fang, Fremont, CA (US); Gregory Alan Fish, Santa Barbara, CA (US); John Hutchinson, Santa Barbara, CA (US)

(73) Assignee: Aurrion, Inc., Goleta, CA (US)

( * ) Notice: Subject to any disclaimer, the term of this patent is extended or adjusted under 35 U.S.C. 154(b) by 0 days.

(21) Appl. No.: 13/249,753

(22) Filed: Sep. 30, 2011

(65) Prior Publication Data

US 2013/0083815 A1 Apr. 4, 2013

(51) Int. Cl.
*H01S 3/10* (2006.01)
*H01S 5/00* (2006.01)
(Continued)

(52) U.S. Cl.
CPC ............ *H01S 5/142* (2013.01); *H01S 3/1003* (2013.01); *H01S 3/1305* (2013.01); *H01S 5/021* (2013.01);
(Continued)

(58) Field of Classification Search
CPC ........ H01S 5/142; H01S 5/026; H01S 5/0265; H01S 5/1209; H01S 3/0675;
(Continued)

(56) References Cited

U.S. PATENT DOCUMENTS 5,267,252 A * 11/1993 Amano ........................... 372/34
5,349,601 A * 9/1994 Hohimer ................. H01S 5/026
372/6

(Continued)

FOREIGN PATENT DOCUMENTS

EP 1 811 619 7/2007
EP 2 071 683 6/2009

OTHER PUBLICATIONS

Chen, et al., "Electronically Pumped Room-Temperature Pulsed InGaAsP-Si Hybrid Lasers Based on Metal Bonding", Chin. Phys. Lett. vol. 26, No. 6 (2009) 064211, IOPScience, 2009 Chinese Physical Society and IOP Publishing Ltd., pp. 064211-1 to 064211-3,, (2009), 064211-1 to 064211-3.

(Continued)

*Primary Examiner* — Yuanda Zhang
(74) *Attorney, Agent, or Firm* — Schwegman Lundberg & Woessner, P.A.

(57) ABSTRACT

In the prior art, tunable lasers utilizing silicon-based tunable ring filters and III-V semiconductor-based gain regions required the heterogeneous integration of independently formed silicon and III-V semiconductor based optical elements, resulting in large optical devices requiring a complex manufacturing process (e.g., airtight packaging to couple the devices formed on different substrates, precise alignment for the elements, etc.). Embodiments of the invention eliminate the need for bulk optical elements and hermetic packaging, via the use of hybridized III-V/silicon gain regions and silicon optical components, such as silicon wavelength filters and silicon wavelength references, thereby reducing the size and manufacturing complexity of tunable lasing devices. For example, embodiments of the invention may utilize hybridized III-V/silicon gain regions with ring filters on silicon form a tunable laser with efficient gain from the III-V region, while providing wide tunability, efficient tunability, and narrow linewidth due to the nature of the silicon rings.

7 Claims, 4 Drawing Sheets

(51) Int. Cl.

| | | |
|---|---|---|
| *H01S 3/083* | (2006.01) | |
| *H01S 5/14* | (2006.01) | |
| *H01S 5/02* | (2006.01) | |
| *H01S 5/10* | (2006.01) | |
| *H01S 3/13* | (2006.01) | |
| *H01S 5/024* | (2006.01) | |
| *H01S 5/026* | (2006.01) | |

(52) U.S. Cl.
CPC .......... *H01S 5/026* (2013.01); *H01S 5/02453* (2013.01); *H01S 5/1028* (2013.01); *H01S 5/0265* (2013.01)

(58) Field of Classification Search
CPC .... H01S 3/1055; H01S 3/0637; H01S 3/1003; H01S 3/10023; H01S 3/0014; H01S 3/10015; H01S 5/02453; H01S 3/1305; H01S 5/1028; H01S 5/021
USPC .................................................. 372/20, 50.1
See application file for complete search history.

(56) References Cited

U.S. PATENT DOCUMENTS

| | | | |
|---|---|---|---|
| 6,349,103 B1 | 2/2002 | Chung et al. | |
| 6,434,175 B1 | 8/2002 | Zah | |
| 6,665,320 B1 | 12/2003 | Arbore et al. | |
| 6,665,321 B1* | 12/2003 | Sochava et al. | 372/20 |
| 6,714,556 B1 | 3/2004 | Egbert | |
| 7,079,721 B2 | 7/2006 | Kish, Jr. et al. | |
| 7,181,105 B2 | 2/2007 | Teramura et al. | |
| 7,339,962 B2 | 3/2008 | Farrell et al. | |
| 7,349,631 B2 | 3/2008 | Lee et al. | |
| 7,512,295 B2 | 3/2009 | Welch et al. | |
| 7,636,522 B2 | 12/2009 | Nagarajan et al. | |
| 8,457,165 B2 | 6/2013 | Liu et al. | |
| 8,457,465 B1 | 6/2013 | Urata et al. | |
| 2001/0051019 A1 | 12/2001 | Bailey et al. | |
| 2002/0105045 A1* | 8/2002 | Kawamura | 257/467 |
| 2003/0002143 A1 | 1/2003 | Inoue et al. | |
| 2003/0095736 A1 | 5/2003 | Kish, Jr. et al. | |
| 2005/0244994 A1* | 11/2005 | Meliga et al. | 438/22 |
| 2006/0013273 A1* | 1/2006 | Menon | H01S 5/026 372/32 |
| 2006/0187537 A1* | 8/2006 | Huber et al. | 359/337.22 |
| 2006/0239314 A1* | 10/2006 | Hosking | 372/34 |
| 2007/0230856 A1* | 10/2007 | Yamazaki | G02F 1/0147 385/5 |
| 2007/0242918 A1 | 10/2007 | Welch et al. | |
| 2008/0159340 A1 | 7/2008 | Daiber et al. | |
| 2008/0232409 A1* | 9/2008 | Yamazaki | G02F 1/0147 372/20 |
| 2009/0285251 A1 | 11/2009 | Yamazaki | |
| 2011/0085572 A1 | 4/2011 | Dallesasse et al. | |
| 2011/0085577 A1 | 4/2011 | Krasulick et al. | |
| 2011/0293279 A1 | 12/2011 | Lam et al. | |
| 2011/0310918 A1* | 12/2011 | Yoon | H01S 5/026 372/26 |
| 2012/0020616 A1 | 1/2012 | Babie et al. | |
| 2012/0074514 A1* | 3/2012 | Nguyen et al. | 257/467 |
| 2013/0016423 A1* | 1/2013 | Zheng | H01S 5/142 359/344 |
| 2013/0016744 A1* | 1/2013 | Li | H01S 5/142 372/20 |
| 2013/0044772 A1 | 2/2013 | Ensher et al. | |
| 2013/0315269 A1 | 11/2013 | Liu et al. | |

OTHER PUBLICATIONS

Chu, et al., "Compact, lower-power-consumption wavelength tunable laser axbricated with silicon photonic-wire waveguide microring resonators", 2009 Optical Society of America, Aug. 3, 2009/vol. 17, No.16/Optics Express 14063, 2009 OSA, (Aug. 3, 2009), 6 pages.

Wesstrom, et al., "State-of-the-art performance of widely tunable modulated grating Y-branch lasers", TuE2, 2004 OSA/OFC 2004, Optical Society of America, (2004), 3 pages.

Extended European Search Report for European Patent Application No. 12006832.5-1564 dated Aug. 20, 2013, 10 pages.

Fujioka, et al., "Compact and Low Power Consumption Hybrid Integrated Wavelength Tunable Laser Module Using Silicon Waveguide Resonators," Journal of Lightwave Technology, vol. 28, No. 21, Nov. 1, 2010, IEEE Service, 6 pages.

"European Application Serial No. 12006832.5, Examination Notification Art. 94(3) mailed Sep. 24, 2014", 8 pgs.

Chan, Chun-Kit, et al., "A Fast 100-Channel Wavelength-Tunable Transmitter for Optical Packet Switching", IEEE Photonics Technology Letters, vol. 13(7), (Jul. 2001), pp. 729-731.

Heck, Martijn J. R., et al., "Monolithic AWG-based Discretely Tunable Laser Diode With Nanosecond Switching Speed", IEEE Photonics Technology Letter 21(13), (Jul. 2009), 905-907.

Ishida, Osamu, et al., "Digitally Tunable Optical Filters Using Arrayed-Waveguide Grating (AWG) Multiplexers and Optical Switches", Journal of Lightwave Technology 15(2), (Feb. 1997), pp. 321-327.

"U.S. Appl. No. 14/262,502, Non-Final Office Action mailed Feb. 27, 2015", 10 pgs.

"U.S. Appl. No. 14/292,554, Restriction Requirement mailed May 20, 2015", 6 pgs.

"U.S. Appl. No. 14/262,502, Final Office Action mailed Sep. 3, 2015", 11 pgs.

"U.S. Appl. No. 14/262,502, Response filed Jun. 29, 2015 to Non Final Office Action mailed Feb. 27, 2015", 13 pgs.

"U.S. Appl. No. 14/292,554, Response filed Sep. 21, 2015 to Restriction Requirement mailed May 20, 2015", 9 pgs.

"U.S. Appl. No. 14/262,502, Non Final Office Action mailed Mar. 1, 2016", 9 pgs.

"U.S. Appl. No. 14/292,554, Non Final Office Action mailed Dec. 23, 2015", 14 pgs.

"European Application Serial No. 12006832.5, Communication Pursuant to Article 94(3) EPC mailed Jun. 7, 2016", 4 pgs.

"U.S. Appl. No. 14/262,502, Corrected Notice of Allowance mailed Dec. 30, 2016", 2 pgs.

"U.S. Appl. No. 14/262,502, Notice of Allowance mailed Dec. 1, 2016", 7 pgs.

"U.S. Appl. No. 14/262,502, Response filed Jan. 4, 2016 to Final Office Action mailed Sep. 3, 2015", 7 pgs.

"U.S. Appl. No. 14/262,502, Response filed Aug. 29, 2016 to Non Final Office Action mailed Mar. 1, 2016", 11 pgs.

"European Application Serial No. 12006832.5, Response filed Feb. 5, 2015 to Office Action mailed Sep. 24, 2014", 18 pgs.

"European Application Serial No. 12006832.5, Response filed Oct. 27, 2016 to Communication Pursuant to Article 94(3) EPC mailed Jun. 7, 2016", 21 pgs.

* cited by examiner

TUNABLE LASER WITH INTEGRATED WAVELENGTH REFERENCE

TECHNICAL FIELD

This disclosure relates generally to the field of photonics, and in particular but not exclusively, tunable semiconductor lasers.

BACKGROUND

Wavelength tunable semiconductor laser devices supply optical power and signals used in applications where precise wavelength control must be maintained, such as optical wavelength division multiplexing (WDM) communication systems and fiber optic networks. The wavelength of the output of tunable laser devices varies based on a feedback control system. This control system will utilize some form of wavelength dependent optical filters to control the wavelength of the light input to the gain medium of the laser device. Wavelength references will further stabilize the laser output of the device.

Existing tunable lasers may use a combination of independently fabricated silicon and III-V semiconductor based optical components. III-V semiconductor materials are not as effective compared to silicon materials for making low loss, compact, wavelength tunable filters, while silicon materials are not as optically efficient as III-V semiconductor materials for emitting light. Thus, in the prior art, utilizing silicon-based wavelength filters and having optically active regions with the optical efficiency of III-V semiconductor-based devices requires the combination of separately formed silicon and III-V semiconductor based optical elements. This combination of separately formed optical elements results in a larger optical devices requiring a complex manufacturing processes not on a wafer scale (e.g., hermetic packaging to couple the devices formed on different substrates, precise alignment for the elements, etc.).

DESCRIPTION OF THE DRAWINGS

Non-limiting and non-exhaustive embodiments of the invention are described with reference to the following figures, wherein like reference numerals refer to like parts throughout the various views unless otherwise specified. It should be appreciated that the following figures may not be drawn to scale.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

SPECIFICATION

Embodiments of an apparatus, system and method to utilize a silicon substrate-based tunable laser having a wavelength dependent optical filter and a wavelength reference formed in the silicon substrate are described herein. Said silicon-based tunable laser will further have a gain region at least partially formed in the silicon substrate. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
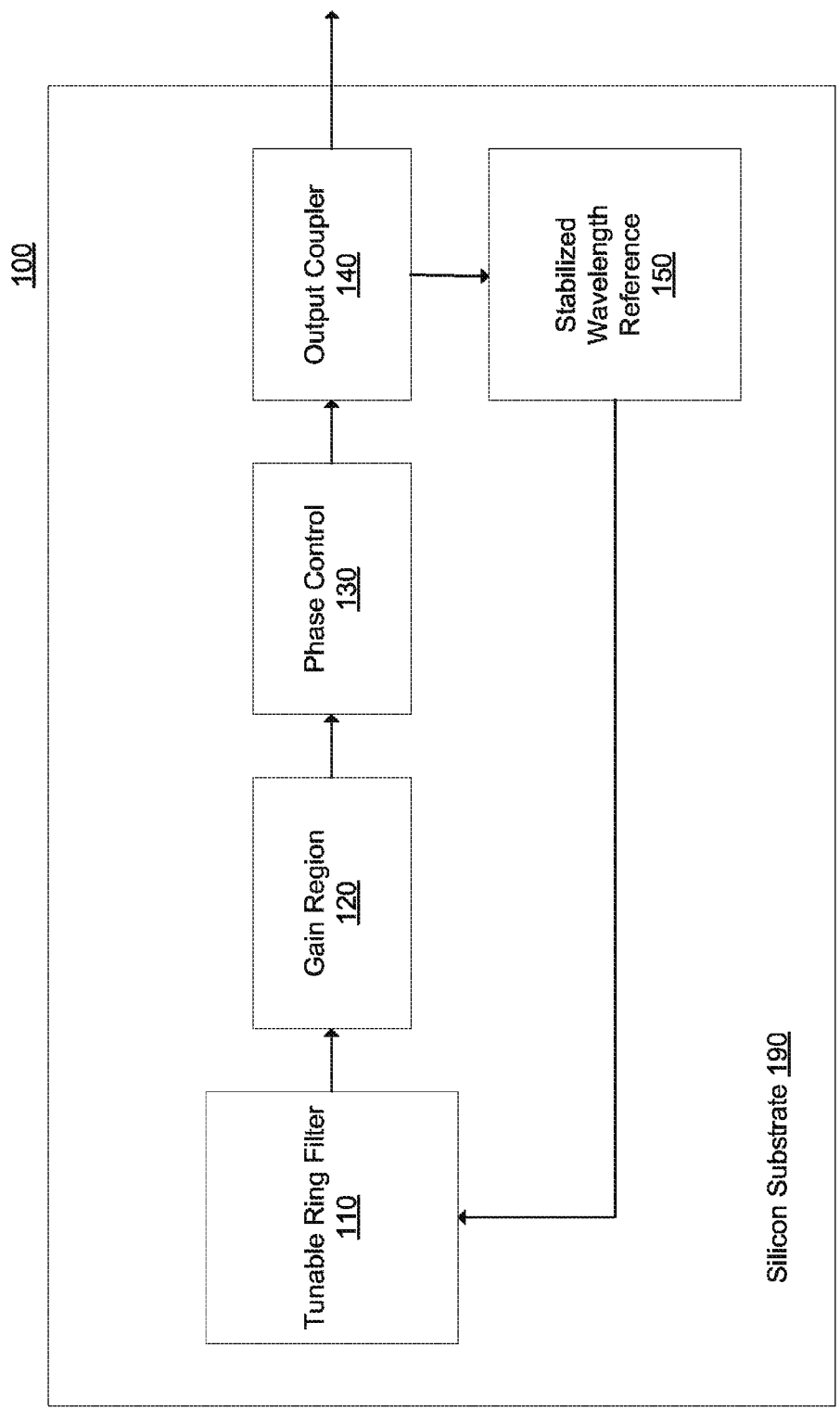
FIG. 1 is a block diagram of a tunable laser according to an embodiment of the invention.

FIG. 1 is a block diagram of a tunable laser according to an embodiment of the invention. In this embodiment, laser 100 includes tunable ring filter (TRF) 110, gain region 120, phase control region 130, output coupler 140 and stabilized wavelength reference 150. The above components may be formed in passive regions of silicon substrate 190, except gain region 120, which may be partially formed in an active region of silicon substrate 190 (in one embodiment described below, gain region 120 further includes III-V semiconductor material).

TRF 110 selects the wavelength for laser 100. TRF 110 includes a tuning region which, when a bias voltage is applied, determines the specific wavelength of the signal received by gain region 120. Phase control region 130 may perform fine control of the laser characteristics of light received from gain region 120. For example, phase control region 130 may adjust the resonant cavity modes associated with the tunable laser. Output coupler 140 extracts at least a portion of the laser light from phase control region 130, and outputs the laser light. Output coupler 140 may further direct a portion of the light to stabilized wavelength reference 150.

In the illustrated embodiment, wavelength reference 150 is used to provide wavelength stability for laser 100. Wavelength reference 150 receives a portion of the laser output for output coupler 140 to provide easy and accurate wavelength determination of the laser output. Wavelength reference 150 may comprise an etalon, interference filter, grating or any functionally equivalent means that passes light at a known wavelength.

Wavelength reference 150 may be utilized to determine a difference between the light from the gain region to a known wavelength value. TRF 110 may then be adjusted based, at least in part, on this determined difference in order to tune the output of laser 100 (e.g., via an electrical signal sent from wavelength reference 150).

In one embodiment, gain region 120 comprises a first region of formed in silicon material of substrate 190 and a second region of non-silicon material with high electro-optic efficiency, such as III-V semiconductors. Said regions may be fabricated independently and subsequently bonded via any bonding process known in the art. The non-silicon semiconductor region of gain region 120 may at least partially overlap the silicon region to create a lateral overlap region; an optical waveguide of the gain region is included in this lateral overlap region, and the waveguide includes both the silicon and the non-silicon material. Thus, the refractive index of at least one of the silicon material and the non-silicon material within the optical waveguide may change based on an electrical difference applied to the gain region.

In one embodiment, the above described non-silicon material is a group III-V semiconductor material. III-V semiconductors have elements that are found in group III and group V of the periodic table (e.g., Indium Phosphide (InP), Indium Gallium Arsenide Phosphide (InGaAsP), Gallium Indium Arsenide Nitride (GaInAsN)). The carrier dispersion effects of III-V based materials may be significantly higher than in silicon based materials for bandgaps closer to the wavelength of the light traversing through gain region 120, as electron speed in III-V semiconductors is much faster than that in silicon. Thus, III-V semiconductor materials enable photonic operation with an increased efficiency at generating light from electricity and converting light back into electricity.

Thus, the active waveguide of gain region 120 is at least partially formed in (or on) the silicon material of substrate 190, and TRF 110, phase control 130 and wavelength reference 150 are also formed in (or on) the silicon material of the substrate. For example, wavelength reference 150 may be formed in or on the silicon material of the substrate by depositing resistive material in or on the silicon, doping the silicon material, or any other functionally equivalent means. The tuning efficiency of silicon-based TRFs is higher than III-V semiconductor-based TRFs, and silicon-based TRFs have narrower linewidths.

III-V semiconductor materials are not as efficient compared to silicon for making low loss, efficient TRFs, while silicon semiconductor materials cannot produce an efficient optical gain without heterogeneous integration of III-V semiconductor material. Thus, in the prior art, utilizing silicon-based TRFs and having the optical efficiency of III-V semiconductor-based gain regions required packaging of silicon and III-V semiconductor based optical elements, resulting in large optical devices that require a complex manufacturing process. Therefore, embodiments of the invention such as the embodiment illustrated in FIG. 1 eliminate the need for bulk optical elements and hermetic packaging, thereby reducing the size and manufacturing complexity of tunable lasing devices.

Figure 2:
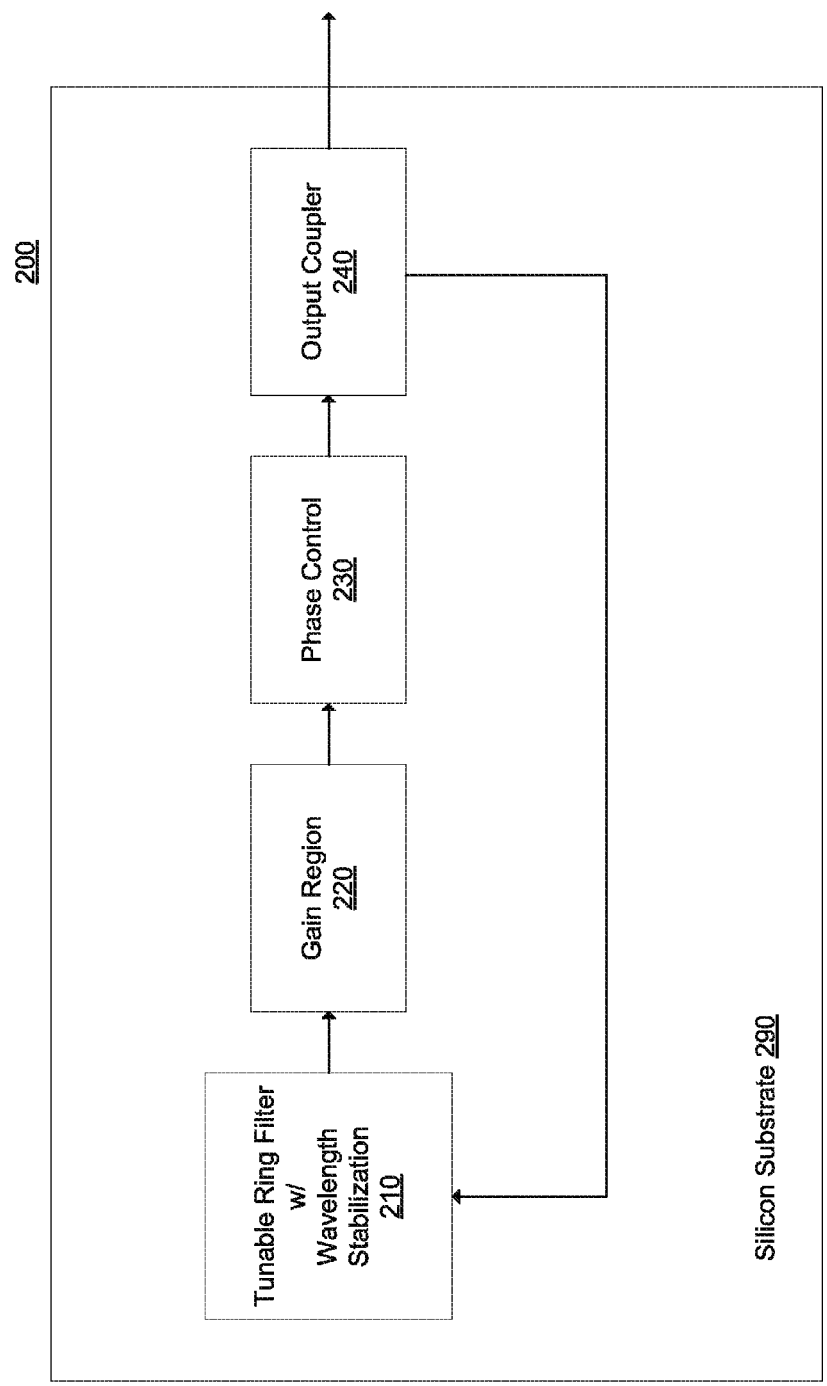
FIG. 2 is a block diagram of a tunable laser having a thermal based wavelength reference according to an embodiment of the invention

FIG. 2 is a block diagram of a tunable laser having a thermal based wavelength reference according to an embodiment of the invention. In this embodiment, laser 200 includes TRF 210, gain region 220, phase control region 230 and output coupler 240. As described above, each of the described elements are either partially or entirely formed in the silicon material of substrate 290, enabling tunable laser 200 to be controlled to the proper wavelength without integrating additional optical components—i.e., optical components not formed from the silicon material of the substrate. TRF 210 may include a heating element associated with an optical ring resonator. Said heating element may be adjusted, based on optical feedback received from output coupler 240, in order to alter the wavelength of laser light passed to gain region 220; said heating element may also be sized to ensure substantial transfer of heat to the respective optical waveguide, and to limit absorbance by the heating element of optical radiation propagating through the respective optical waveguide.

In this embodiment, TRF 210 includes wave stabilization functionality. In one embodiment, highly stable thermal sensors are integrated to provide a stable wavelength reference for the wavelength of the laser light passed from TRF 210 to gain region 220. Thus, in this embodiment of the invention, the wavelength reference is to be integrated within the laser cavity. Highly stable resistive temperature devices (RTDs) formed from silicon substrate 290 may be used to measure the temperature of the wavelength filtering elements. The cavity filter is arranged such that changes in the refractive index due to stress are minimized and the temperature is directly related to the laser wavelength and thus, determining the laser wavelength may be done by measuring the temperature of the wavelength filtering elements via the above described RTDs.

Figure 3:
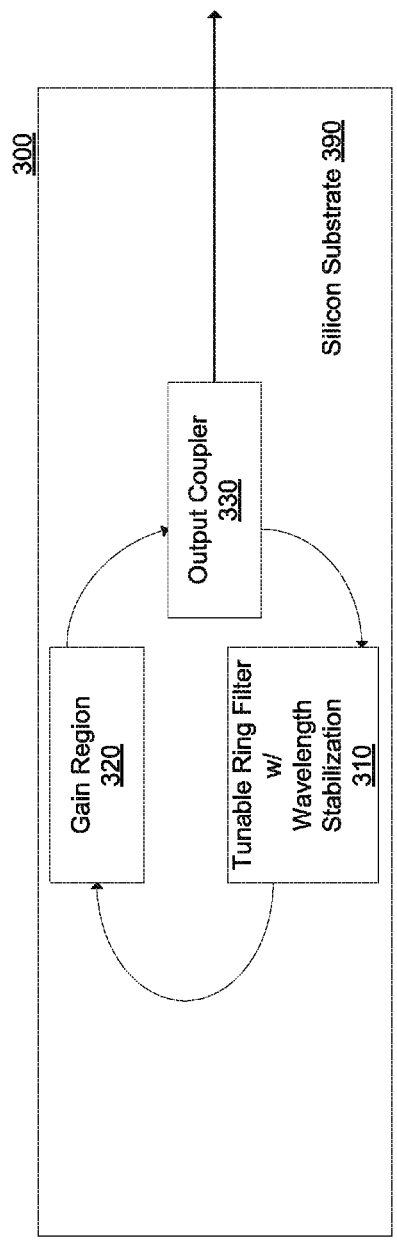
FIG. 3 is a block diagram of a tunable laser having a ring topography according to an embodiment of the invention.

By eliminating the need to integrate additional optical components for tunable lasers, embodiments of the invention may form other variants of tunable lasers with a reduced device footprint. FIG. 3 is a block diagram of a tunable laser having an alternative topography according to an embodiment of the invention. In this embodiment, laser 300 includes TRF 310, gain 320 and output coupler 330 configured in a ring topography which could produce lower linewidth lasers due to the unidirectional light propogation in the laser (as opposed to the bi-directional light propagation illustrated in FIG. 2). As described above, each of these described elements are either partially or entirely formed in the silicon material of substrate 390.

Figure 4:
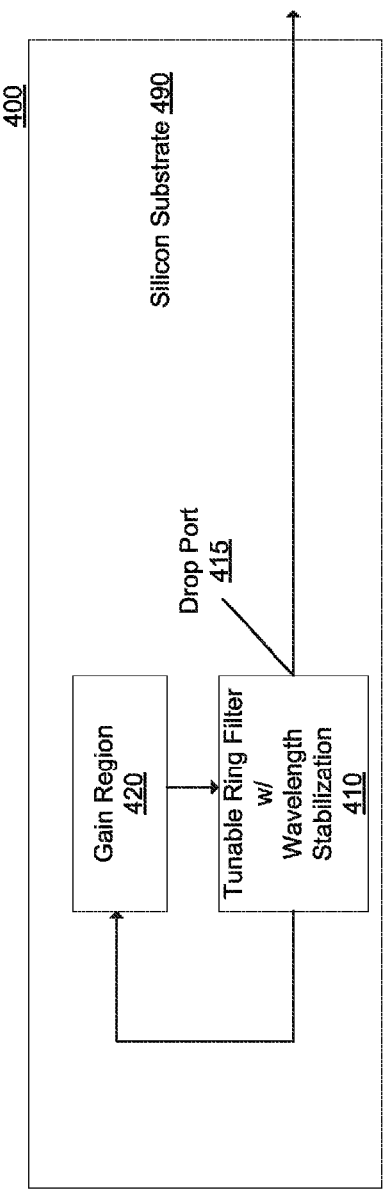
FIG. 4 is a block diagram of a tunable laser outputting lasing light via a drop port of a tunable ring filter according to an embodiment of the invention.

FIG. 4 is a block diagram of a tunable laser outputting lasing light via a drop port of a tunable ring filter according to an embodiment of the invention. In this embodiment, laser 400 includes TRF 410 and gain region 420. As described above, each of these described elements are either partially or entirely formed in the silicon material of substrate 490.

The use of an output coupler, as described in previous example embodiments, may be eliminated. For laser 400, light is output via drop port 415 of TRF 410, further reducing the device footprint necessary for a wavelength tunable laser.

Figure 5:
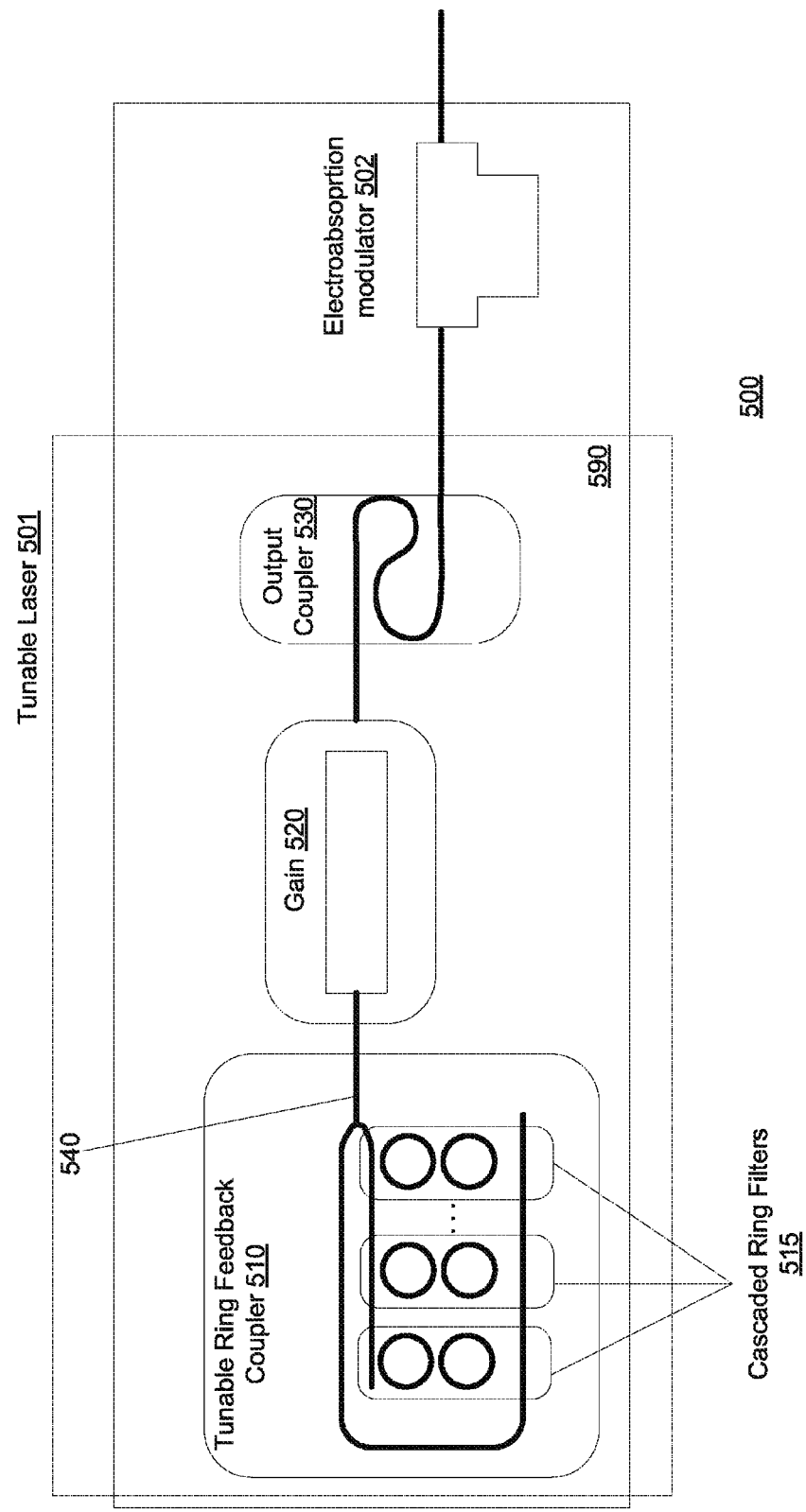
FIG. 5 is a diagram of an optical system utilizing a plurality of cascaded tunable ring filters according to an embodiment of the invention.

FIG. 5 is a diagram of an optical system utilizing a plurality of cascaded tunable ring filters according to an embodiment of the invention. In this embodiment, optical system 500 includes tunable laser 501 and silicon evanescent electro-absorption modulator 502. The tunable laser further includes tunable ring feedback coupler 510, silicon evanescent gain 520 and laser output coupler 530.

Tuning ring feedback coupler 510 may include cascaded ring filters 515. In this embodiment, the ring filters each have slightly different radii and are laterally coupled to input/output waveguide 540 in a cascaded arrangement. It is understood that varying the radii of ring filters 515 slightly allows for a wide range of tuning for laser 501, due to the Vernier effect (i.e., a large tuning effect is accomplished by exploiting the Vernier effect, by which small relative refractive index changes may be used to yield large relative wavelength changes).

Thus, the use of a hybridized III-V/silicon gain region (hybrid silicon laser or hybrid ridge lasers) with cascaded Vernier ring filters formed from the silicon material of substrate 590 allow for efficient gain from the III-V region, while providing wide tunability, efficient tunability, and narrow linewidth due to the narrow linewidth nature of silicon rings.

Modulator 502 may perform either amplitude or phase modulation of the light received from tunable laser 501. Modulator 502 may include a waveguide comprising silicon and III-V semiconductor material, similar to the gain regions described above. In one embodiment, optical system 500 is included in a single device or chip, wherein silicon components of system 500 are included on a silicon portion of the chip, and III-V semiconductor components of system 500 are included on a III-V portion of the chip. Said portions may be fabricated independently and subsequently bonded via any bonding process known in the art.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

The invention claimed is:

1. A tunable laser, comprising:
    a silicon substrate defining a waveguide, the waveguide being configured to propagate light, the silicon substrate including a gain region configured to amplify light propagating through the waveguide and including a silicon material and a III-V semiconductor material, the silicon substrate further including a passive region configured to filter a wavelength of light propagating through the waveguide, the passive region including at least a portion of a laser cavity, the laser cavity arranged in a ring topography so that light propagates in a single direction within the laser cavity;
    an output coupler formed in a passive region of the silicon substrate, the output coupler configured to allow amplified and filtered light to exit the waveguide, the output coupler further configured to produce optical feedback from the amplified and filtered light in the waveguide; and
    a heating element disposed proximate the waveguide, the heating element configured to adjust a temperature of the passive region in response to the optical feedback thereby to adjust the wavelength of light filtered in the waveguide.

2. The tunable laser of claim 1, wherein the passive region of the silicon substrate includes a tunable ring filter.

3. The tunable laser of claim 1, wherein the passive region of the silicon substrate includes a plurality of cascaded tunable ring filters, each tunable ring filter having a different radius value.

4. The tunable laser of claim 3, wherein the waveguide extends through an electroabsorption modulator configured to perform amplitude or phase modulation of light propagating within the waveguide.

5. The tunable laser of claim 4, wherein the output coupler is positioned along the waveguide between the electroabsorption modulator and the plurality of cascaded tunable ring filters.

6. The tunable laser of claim 1, wherein the waveguide extends through a phase control region formed in a passive region of the silicon substrate, the phase control region being configured to adjust resonant cavity modes of the laser cavity.

7. The tunable laser of claim 6, wherein the phase control region is positioned along the waveguide between the wavelength reference and the gain region.

\* \* \* \* \*